United States Patent
Asaba

(10) Patent No.: US 7,414,233 B2
(45) Date of Patent: Aug. 19, 2008

(54) PIXEL CIRCUIT WITH SURFACE DOPED REGION BETWEEN MULTIPLE TRANSFER TRANSISTORS AND IMAGE SENSOR INCLUDING THE SAME

(75) Inventor: Tetsuo Asaba, Suwon-Si (KR)

(73) Assignee: Samsung Electronic Co., Ltd., Suwon-si (KR)

( * ) Notice: Subject to any disclaimer, the term of this patent is extended or adjusted under 35 U.S.C. 154(b) by 0 days.

(21) Appl. No.: 11/455,389

(22) Filed: Jun. 19, 2006

(65) Prior Publication Data

US 2006/0284054 A1  Dec. 21, 2006

(30) Foreign Application Priority Data

Jun. 20, 2005  (KR) ............ 10-2005-0053017

(51) Int. Cl.
*H01L 27/00*  (2006.01)

(52) U.S. Cl. ............ 250/208.1; 250/214.1; 250/214 R; 257/239; 348/294; 348/308

(58) Field of Classification Search ............... 250/208.1, 250/214 DC, 214.1; 257/204, 225, 239; 348/294, 348/297, 307, 308
See application file for complete search history.

(56) References Cited

U.S. PATENT DOCUMENTS

| 6,731,335 | B1 | 5/2004 | Kim et al. ............ 348/308 |
| 2005/0110093 | A1* | 5/2005 | Altice et al. ............ 257/359 |
| 2006/0044437 | A1* | 3/2006 | Shah ............ 348/308 |
| 2006/0046338 | A1* | 3/2006 | Patrick et al. ............ 438/57 |

OTHER PUBLICATIONS

Korean Patent Application No. 1019990061270 to Min, having Publication date of Jul. 5, 2001 (w/ English Abstract page).
Japanese Patent Application No. 2003-044997 to Shoji et al., having Publication date of Sep. 9, 2004 (w/ English Abstract page).
Japanese Patent Application No. 07-197471 to Hidekazu, having Publication date of Feb. 14, 1997 (w/ English Abstract page).

* cited by examiner

*Primary Examiner*—Georgia Y. Epps
*Assistant Examiner*—Francis M Legasse, Jr.
(74) *Attorney, Agent, or Firm*—Monica H. Choi

(57) ABSTRACT

A pixel circuit of an image sensor includes a photo-converting unit such as a photo-diode for generating charge from incident light. The pixel circuit also includes a charge storing capacitor for storing the charge generated by the photo-converting unit. The pixel circuit further includes a floating diffusion node that receives the charge from the charge storing unit after being reset. Thus, an image signal VSIG is generated after a reset signal VRES is generated from the pixel circuit.

20 Claims, 6 Drawing Sheets

PIXEL CIRCUIT WITH SURFACE DOPED REGION BETWEEN MULTIPLE TRANSFER TRANSISTORS AND IMAGE SENSOR INCLUDING THE SAME

BACKGROUND OF THE INVENTION

This application claims priority to Korean Patent Application No. 2005-53017, filed on Jun. 20, 2005 in the Korean Intellectual Property Office, the disclosure of which is incorporated herein in its entirety by reference.

1. Field of the Invention

The present invention relates generally to image sensors, and more particularly, to a pixel circuit with low noise for a global shutter operation in a CMOS image sensor.

2. Description of the Related Art

A CMOS image sensor (CIS) in a cellular phone camera, a digital still camera, etc., converts images into electrical signals, and converts the electrical signals into digital signals. A digital image signal output from the CMOS image sensor is color (Red, Green, or Blue) image data. The digital image signal is further processed for driving a display, such as a LCD.

FIG. 1 is a block diagram of a conventional CMOS image sensor 100. Referring to FIG. 1, the image sensor 100 includes an Active Pixel Sensor (APS) array 110, a row driver 120, and an analog to digital converter (ADC) 130. The row driver 120 receives control signals from a row decoder (not shown), and the ADC 130 receives control signals from a column decoder (not shown).

FIG. 2 is an example of a color filter pattern of the APS array 110 of FIG. 1 when the image sensor 100 is a color image sensor. Each pixel in the APS array 110 has a respective color filter that passes through a certain color of light to be sensed by the pixel. FIG. 2 shows a Bayer color filter pattern having two colors, red (R) and green (G), and another two colors, green (G) and blue (B), alternately arranged in respective rows.

In addition, the G color associated with a brightness signal is assigned to all the rows, and the R color and the B color are alternately assigned to the respective rows so that brightness resolution is enhanced. Typical electronic devices such as digital still cameras use a CIS with millions of pixels for increased resolution.

The APS array 110 senses light using photodiodes that convert light into an electrical signal, thus generating image signals. The analog image signals output from the APS array 110 are for three colors, R, G, and B. The ADC 130 receives the analog image signals from the pixel array 110 for conversion into digital signals using a Correlated Double Sampling (CDS) method. The CDS method is known to those of ordinary skill in the art, and therefore a detailed description thereof is omitted.

FIG. 3 is a circuit diagram of an example pixel circuit 300 within the APS array 110 of FIG. 1. Each pixel in the APS array 100 has a respective pixel circuit that is similar to the pixel circuit 300 of FIG. 3 including a respective photodiode PD and respective four transistors. Such a configuration of the pixel circuit 300 of FIG. 3 is well known to one of ordinary skill in the art.

The pixel circuit 300 performs a rolling shutter operation or a global shutter operation depending on control/supply signals RX, TX, SEL, and VDD. In a rolling shutter operation, rows in a frame are sequentially selected one by one such that signals photo-electrically generated by photodiodes of the selected row are transferred to floating diffusion (FD) nodes to be output as image signals.

In a global shutter operation, signals photo-electrically transformed by all photodiodes of all rows in a frame are transferred simultaneously to FD nodes. Subsequently, rows are sequentially selected for outputting image signals from each selected row at a time.

In either of the rolling or global shutter operations, for each pixel in a row selected by a row selection signal SEL, a reset control signal RX is activated. In that case, a supply voltage VDD is coupled to the FD node for being output as a reset signal VRES. In addition, a signal generated by a photodiode PD is transferred to the FD node for being output as an image signal VSIG when a transfer control signal TX is activated.

Generally, in the rolling shutter operation, after the reset signal VRES is output, the image signal VSIG is output. However, in the global shutter operation, after the image signal VSIG is output, the reset signal VRES is output. Referring to FIG. 1, the ADC 130 performs A/D (analog to digital) conversion on the difference between the reset signal VRES and the image signal VSIG for correlated double sampling. The row selection signal SEL, the reset control signal RX, and the transfer control signal TX may be generated by the row driver 120.

FIG. 4 is a cross-sectional view of a silicon (Si) substrate in which the photodiode PD and the transistors of FIG. 3 are formed according to the prior art. When a transfer control signal TX is activated, a corresponding transistor is turned on for connecting the photodiode PD to the FD node.

For the global shutter operation in FIG. 4, respective charges generated by photodiodes of all rows in a frame are transferred simultaneously to the respective FD nodes. Subsequently, corresponding image signals VSIG are output from a selected row at a time. In such a global shutter operation, a reset signal VRES may not be sampled right before the image signal VSIG is sampled for the pixel circuit 300. Rather, a reset signal VRES may be sampled after the image signal VSIG is sampled, which results in increased noise in the global shutter operation.

Also in the circuit structure of FIG. 4, dark current may flow in the surface region of the Si substrate corresponding to the FD node. In the global shutter operation, respective charges from all photodiodes of all rows in a frame are transferred simultaneously to FD nodes. Such charges are held by each FD node in a standby state until the corresponding pixel is selected for signal output. Thus, in rows having long standby times, the amount of charge stored within the FD nodes may vary from dark current.

In the rolling shutter operation, a standby time period between the charge being transferred to the FD node to being read out as a signal is equal for all rows, and the standby time is short. Thus, the influence of dark current is insignificant. However, in the global shutter operation, dark current may result in picture-quality deterioration.

SUMMARY OF THE INVENTION

Accordingly, a pixel circuit in an image sensor includes an additional charge storing unit for generating a reset signal VRES before each image signal VSIG. In addition, a surface-doped region is formed in the charge storing unit for preventing dark current in the charge storing unit.

A pixel circuit of an image sensor according to an aspect of the present invention includes a photo-converting unit such as a photo-diode for generating charge from incident light. The pixel circuit also includes a charge storing unit for storing the charge generated by the photo-converting unit. The pixel circuit further includes a floating diffusion node that receives the charge from the charge storing unit after being reset.

In an embodiment of the present invention, the pixel circuit further includes first and second transfer transistors. The first transfer transistor is disposed between the photo-converting unit and the charge storing unit, and the second transfer transistor is disposed between the charge storing unit and the floating diffusion node.

In a further embodiment of the present invention, the charge storing unit is a capacitor having a first node formed with a gate structure of the first transfer transistor. For example, the capacitor includes a capacitor diffusion region formed in a semiconductor substrate.

In another embodiment of the present invention, a surface-doped region is formed within the capacitor diffusion region, and disposed between gate structures of the first and second transfer transistors. The surface-doped region is oppositely doped from the capacitor diffusion region that forms a source/drain for the first and second transistors, for reducing dark-current while the capacitor holds the charge from the photo-converting unit.

In a further embodiment of the present invention, a driver generates control signals with a first set of levels to the first and second transfer transistors such that the charge storing unit is first reset for generating a reset signal before the charge generated from the photodiode is transferred to the charge storing unit. In addition, the driver generates the control signals with a second set of levels to the first and second transfer transistors such that the charge from the charge storing unit is transferred to the floating diffusion node for generating an image signal after the reset signal is output from the pixel circuit.

In another embodiment of the present invention, the pixel circuit includes a reset transistor coupled to the floating diffusion node for resetting the floating diffusion node. The pixel circuit also includes a source follower transistor and a selection transistor coupled to the floating diffusion node for outputting a signal corresponding to an amount of charge stored at the floating diffusion node.

The present invention may be used to particular advantage when the image sensor is a CMOS (complementary metal oxide semiconductor) image sensor. However, the present invention may also be advantageously applied for other types of image sensors.

In this manner, the reset signal is generated immediately before the image signal for reduced noise in subsequent CDS (correlated double sampling). In addition, the surface-doped region prevents dark current from the charge storing unit such that rows with long stand-by times do not lose charge in the global shutter operation. Thus, picture-quality is preserved even for an active pixel sensor array having a large number of rows in the global shutter operation.

BRIEF DESCRIPTION OF THE DRAWINGS

The above and other features and advantages of the present invention will become more apparent when described in detailed exemplary embodiments thereof with reference to the attached drawings in which.

The figures referred to herein are drawn for clarity of illustration and are not necessarily drawn to scale. Elements having the same reference number in FIGS. 1, 2, 3, 4, 5, 6, 7, 8A, 8B, 8C, 8D, and 9 refer to elements having similar structure and/or function.

DETAILED DESCRIPTION OF THE INVENTION

Figure 1:
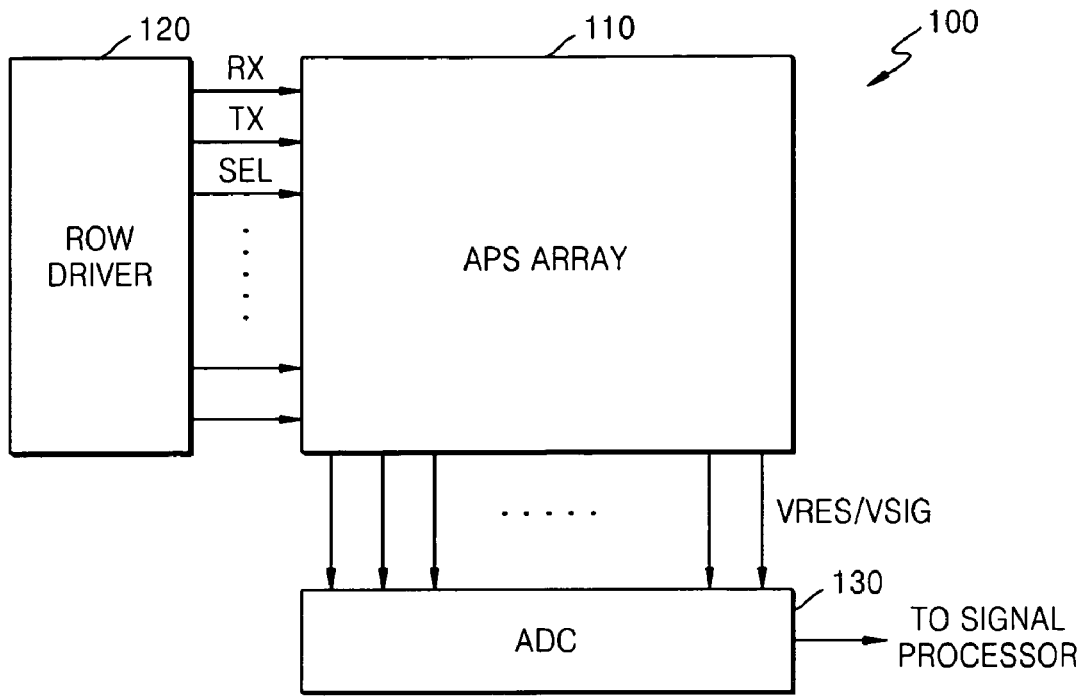
FIG. 1 is a block diagram of a conventional image sensor.
Figure 2:
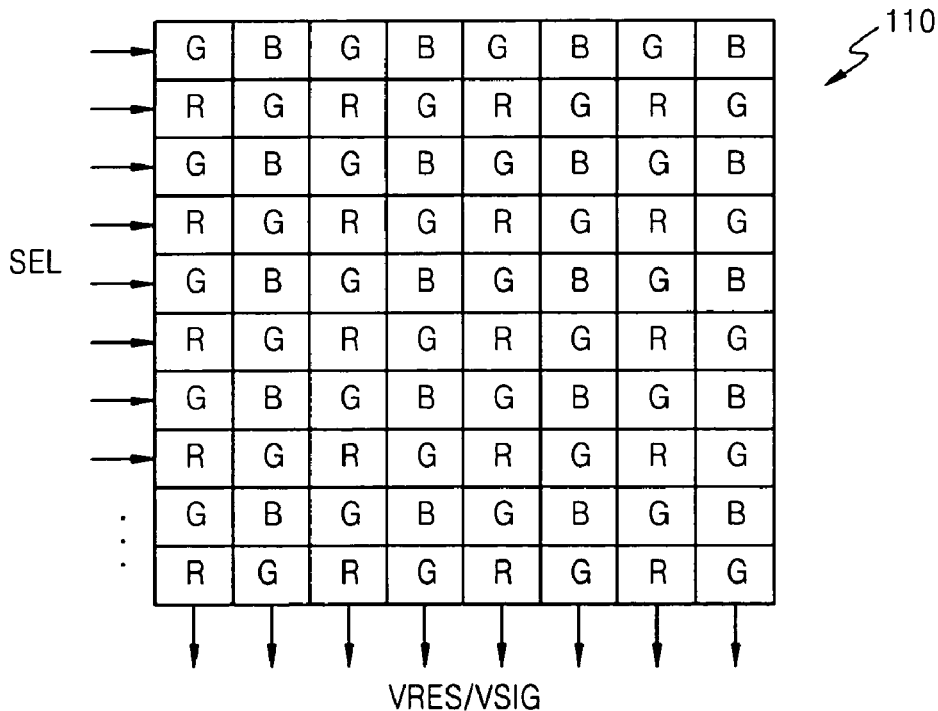
FIG. 2 is an example of a color filter pattern of an Active Pixel Sensor (APS) array of FIG. 1, as known in the prior art.
Figure 3:
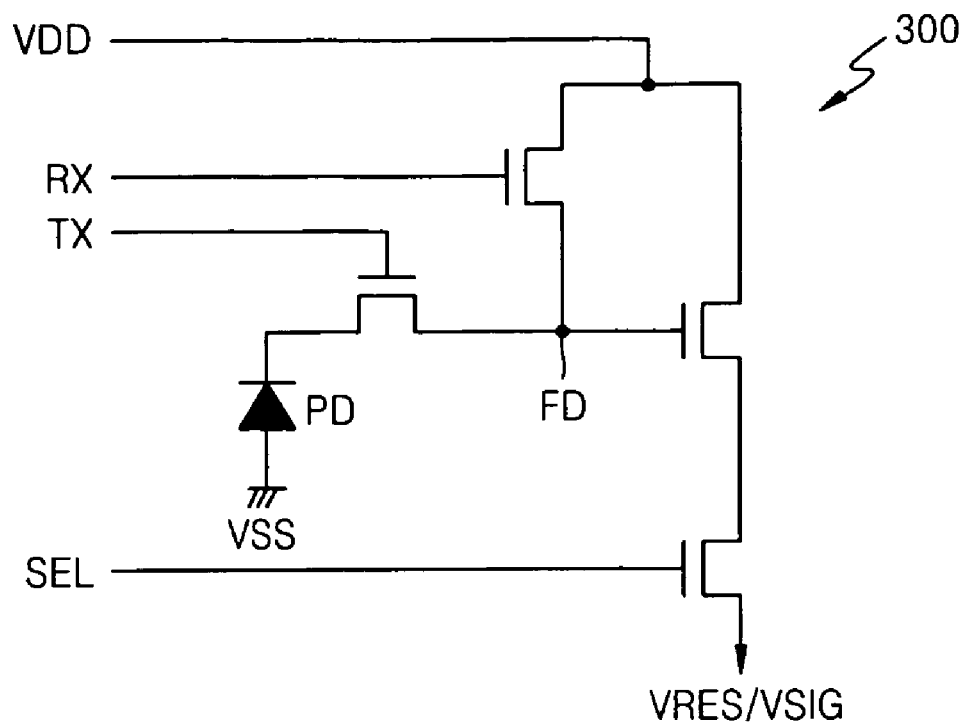
FIG. 3 is a circuit diagram of a pixel driving circuit in the APS array of FIG. 1, as known in the prior art.
Figure 4:
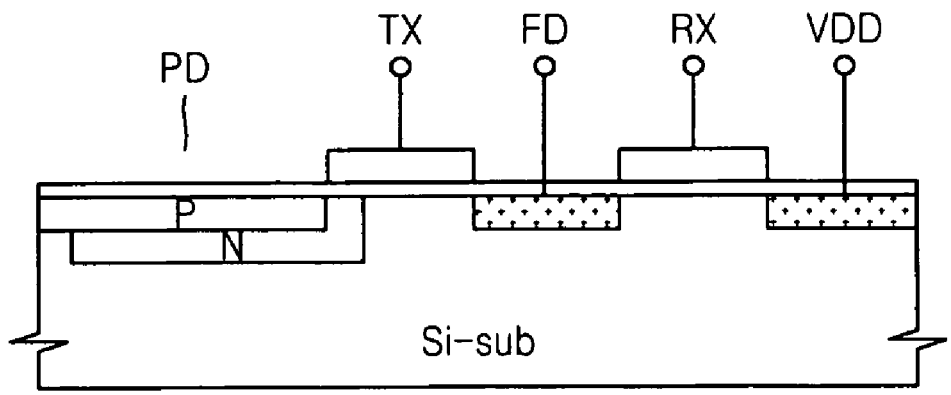
FIG. 4 is a cross-sectional view of a silicon (Si) substrate having a photodiode and transistors of FIG. 3 formed therein, according to the prior art.
Figure 5:
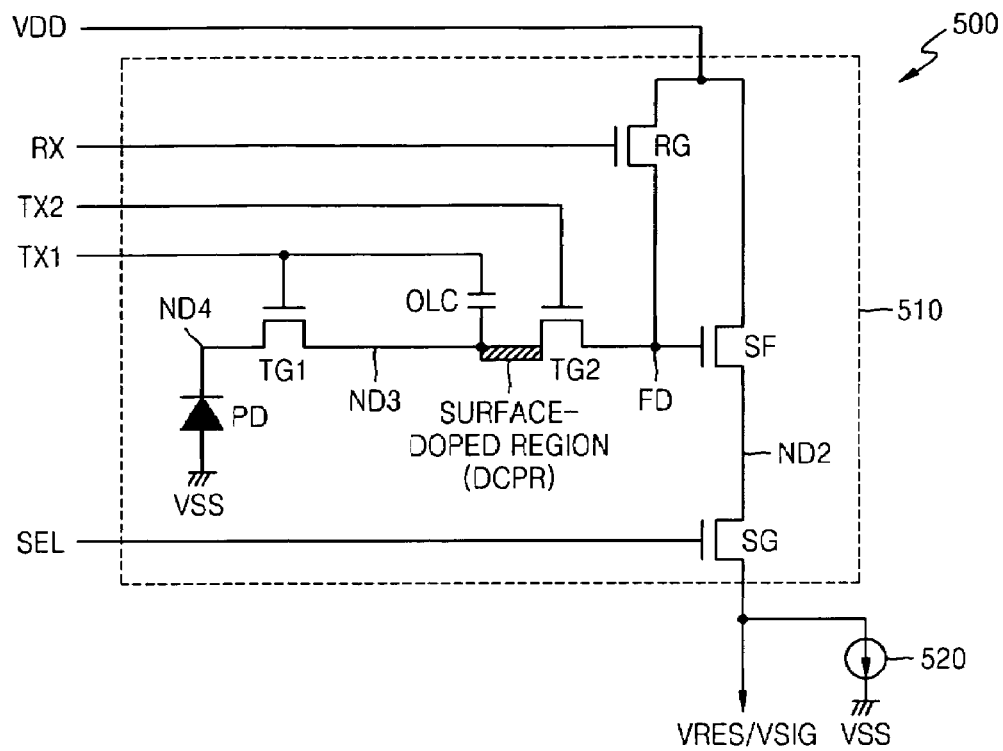
FIG. 5 is a circuit diagram of a pixel driving circuit of an image sensor, according to an embodiment of the present invention.
Figure 9:
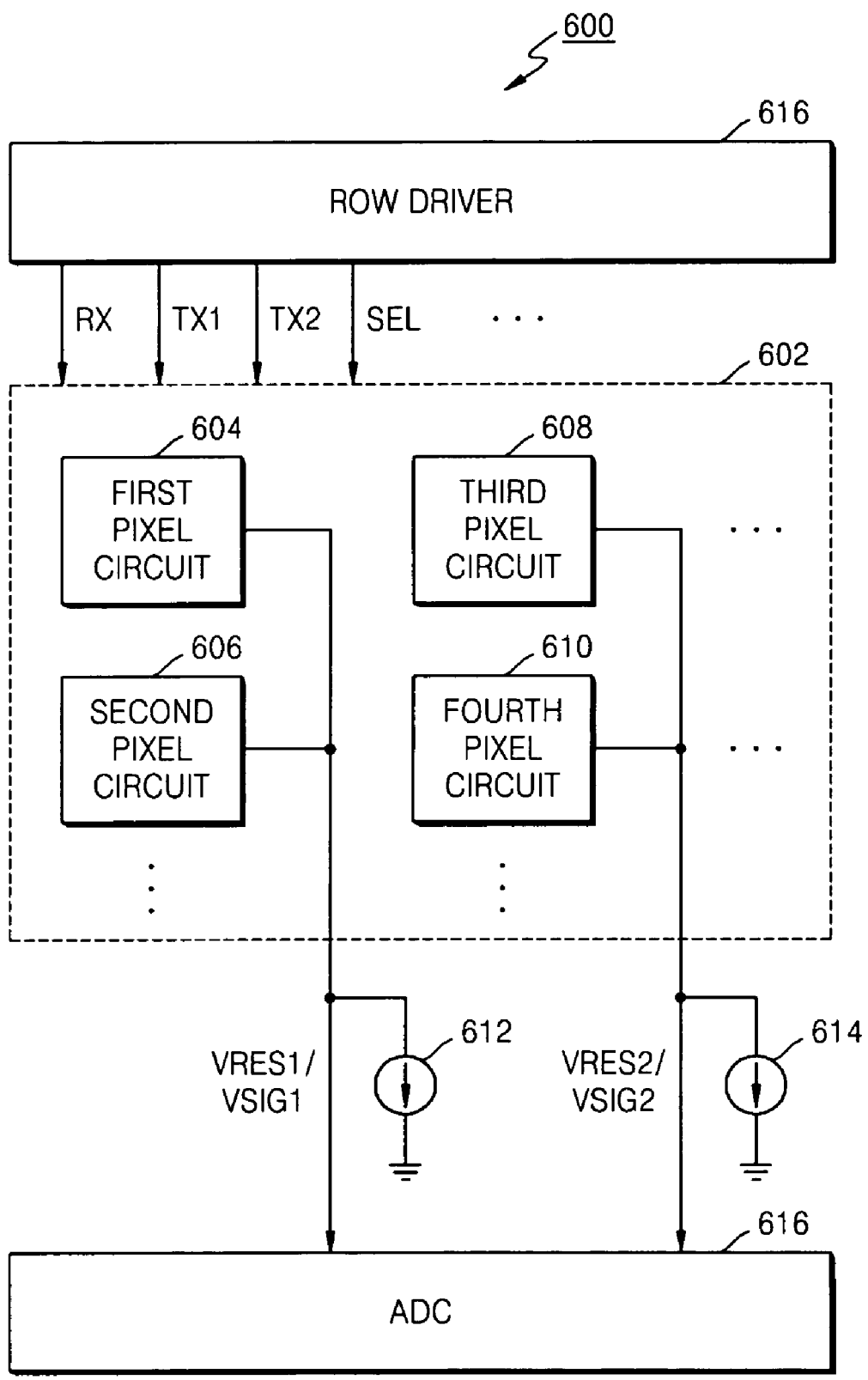
FIG. 9 shows a block diagram of an image sensor having an array of pixel circuits, with each pixel circuit similar to that illustrated in FIG. 5, according to an embodiment of the present invention.

FIG. 5 is a circuit diagram of a pixel driving circuit 500 of a CMOS (complementary metal oxide semiconductor) image sensor 600 in FIG. 9, according to an embodiment of the present invention. Referring to FIG. 5, the pixel driving circuit 500 includes a pixel circuit 510 and a bias circuit 520 for biasing an output node generating a reset signal VRES and an image signal VSIG.

Referring to FIGS. 5 and 9, the CMOS image sensor 600 includes an APS (active pixel sensor) array 602 of a plurality of pixel circuits. FIG. 9 shows a first pixel circuit 604, a second pixel circuit 606, a third pixel circuit 608, and a fourth pixel circuit 610. Four pixel circuits are illustrated in FIG. 9, but a typical CMOS image sensor has more numerous pixel circuits for high resolution of the image sensor.

Each of the pixel circuits 604, 606, 608, and 610 in the APS array 602 is implemented similarly to the pixel circuit 510 of FIG. 5. In addition, a column of pixel circuits is coupled to a respective output node. For example, the first column of pixel circuits 604 and 606 is coupled to a first output node having a first bias circuit 612, and the second column of pixel circuits 608 and 610 is coupled to a second output node having a second bias circuit 614. The bias circuits 612 and 614 may be disposed above or below the APS array 602.

The CMOS image sensor 600 also includes a row driver 616 and an ADC (analog to digital converter) 618. The row driver 616 generates a respective set of control signals RX, TX1, TX2, and SEL for driving each of the pixel circuits 604, 606, 608, and 610 in the APS array 602. The ADC 618 receives a respective reset signal VRES and a respective image signal VSIG from each of the pixel circuits for converting such analog signals to a digital signal with correlated double sampling.

Referring back to FIG. 5, the example pixel circuit 510 includes a row selection transistor SG, a reset transistor RG, a source-follower transistor SF, a first transfer transistor TG1, a second transfer transistor TG2, a charge storing unit such as a capacitor OLC, and a photo-converting unit such as a photodiode PD. All transistors in FIG. 5 are NMOSFETs (N-channel metal oxide semiconductor field effect transistors) in one embodiment of the present invention. However, the present invention may also be practiced with other types of transistors.

A gate electrode of the reset transistor RG has a reset control signal RX applied thereon. A first supply voltage VDD is applied to one of the source/drain of the reset transistor RG, and the other of the source/drain of the reset transistor RG is coupled to a FD node.

A gate electrode of the source-follower transistor SF is coupled to the FD node. The first supply voltage VDD is applied to one of the source/drain of the source-follower transistor SF, and the other of the source/drain of the source-follower transistor SF is coupled to one of the source/drain of the row selection transistor SG.

The other of the source/drain of the row selection transistor SG is coupled to the output node VRES/VSIG. A row selection signal SEL is applied to a gate of the row selection transistor SG.

A first transfer control signal TX1 is applied to a gate of the first transfer transistor TG1. One of the source/drain of the first transfer transistor TG1 is coupled to the charge storing unit OLC, and the other of the source/drain of the first transfer transistor TG1 is coupled to the photo-diode PD.

A second transfer control signal TX2 is applied to a gate of the second transfer transistor TG2. One of the source/drain of the second transfer transistor TG2 is coupled to the FD node, and the other of the source/drain of the second transfer transistor TG2 is coupled to the charge storing unit OLC. The photo-diode PD is coupled between the first transfer transistor TG1 and a second supply voltage VSS.

The pixel circuit 510 may also be implemented without including the row selection transistor SG. In that case, the pixel circuit 510 may still perform a rolling shutter operation and a global shutter operation by slightly modifying the reset control signal RX, the first transfer control signal TX1, the second transfer control signal TX2, and the first source voltage VDD.

Figure 6:
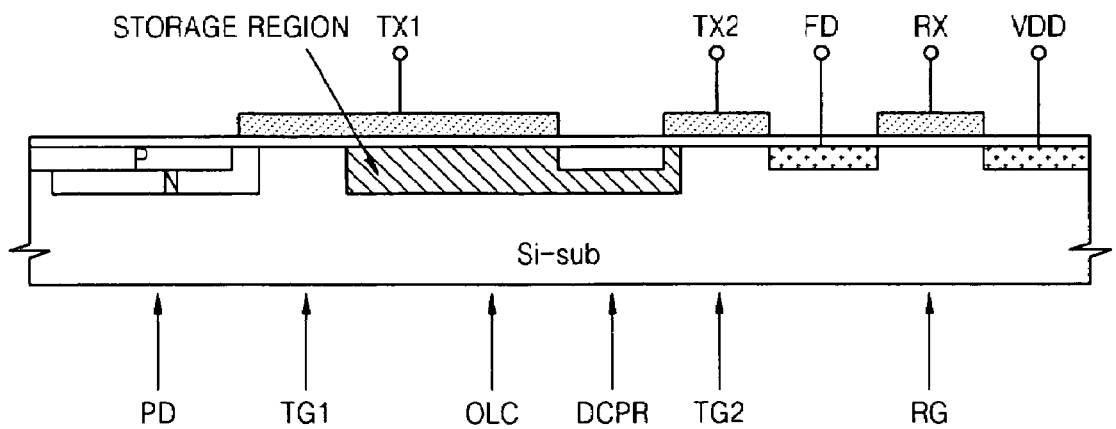
FIG. 6 is a cross-sectional view of a photodiode and transistors of FIG. 5 formed in a semiconductor substrate, according to an embodiment of the present invention.

FIG. 6 shows a cross-sectional view of a silicon (Si) substrate in which the photodiode PD and the transistors TG1, TG2 and RG of FIG. 5 are formed according to an embodiment of the present invention. Referring to FIGS. 5 and 6, the capacitor OLC is formed as a capacitor diffusion region doped with an N-type dopant. Such a region OLC also acts as a shared source/drain of the transfer transistors TG1 and TG2.

In addition, a surface-doped region DCPR is formed within the capacitor diffusion region OLC. Furthermore, the surface-doped region DCPR is formed within the Si-substrate between the gate structures of the first and second transfer transistors TG1 and TG2. In one embodiment of the present invention, the capacitor diffusion region OLC is doped with an N-type dopant, and the surface-doped region DCPR is doped with a P-type dopant. The surface-doped region DCPR prevents dark current from being generated when the surface of the Si substrate is exposed to light.

A portion of the capacitor diffusion region OLC is formed to be disposed under the gate structure of the first transfer transistor TG1 which forms an electrode of the capacitor OLC. With such a capacitor OCL, a reset signal VRES may be sampled just before an image signal VSIG is sampled as will be described herein.

Figure 7:
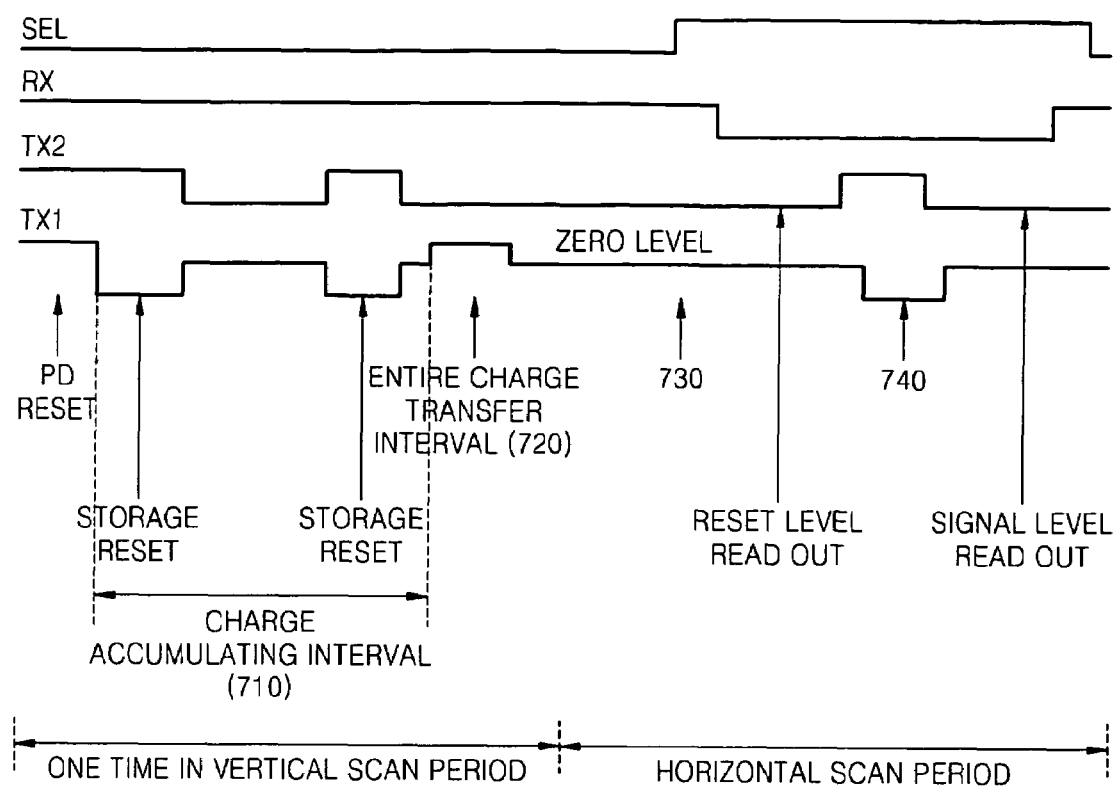
FIG. 7 is a timing diagram of signals used in a pixel circuit of FIG. 5, according to an embodiment of the present invention.

FIG. 7 is a timing diagram of signals during operation of the pixel circuit 510 according to an embodiment of the present invention. FIGS. 8A, 8B, 8C, and 8D are energy band diagrams of the transistor channels of the pixel circuit 510 when driven with the signals of FIG. 7, according to an embodiment of the present invention.

Referring to FIGS. 5, 7, and 9, the control signals SEL, RX, TX2, and TX1 are generated by the row driver 616 in one embodiment of the present invention. The row selection signal SEL is activated to a logic high state once in each horizontal scan period to select a corresponding row. The reset control signal RX is activated to a logic low state for a predetermined time period within the time period when the row selection signal SEL is activated to the logic high state.

The first transfer control signal TX1 has a negative level, a zero level, and a positive level. The first transfer control signal TX1 is at the negative level twice during a charge accumulating interval 710 so as to reset the charge storing capacitor OLC. In addition, the first transfer control signal TX1 is at the positive level (active) for an entire charge transfer interval 720 during which charge generated from the photodiode PD is transferred to the charge storing capacitor OLC.

The present invention may be practiced with the first transfer control signal TX1 having only negative (low) and positive (high) levels and without having a zero level. However, the size or the thickness of a gate insulation film of the first transfer transistor TG1 may be reduced more efficiently when the first transfer control signal TX1 has the three (positive, negative, and zero) levels.

The second transfer control signal TX2 becomes high (active) twice in the charge accumulating interval 710 so as to reset the charge storing capacitor OLC. Then, the second transfer control signal TX2 becomes high (active) once during a predetermined time during the following horizontal scan period while the reset control signal RX is low.

Further referring to FIG. 7, initially, the row selection signal SEL is set to the logic low state, the reset control signal RX is activated to the logic high state, and the second transfer control signal TX2 is activated to the logic high state. In addition, the first transfer control signal TX1 is set to the positive level. Thus, the first supply voltage VDD is applied up to the photo-diode PD through the reset transistor RG and the transfer transistors TG1 and TG2 for resetting the photo-diode PD (as indicated by PD RESET in FIG. 7).

Subsequently, the first transfer control signal TX1 is set to the negative level for turning off the first transfer transistor TG1. The first supply voltage VDD is applied up to the charge storing capacitor OLC for resetting the charge storing capacitor OLC (as indicated by STORAGE RESET in FIG. 7).

Figure 8A:
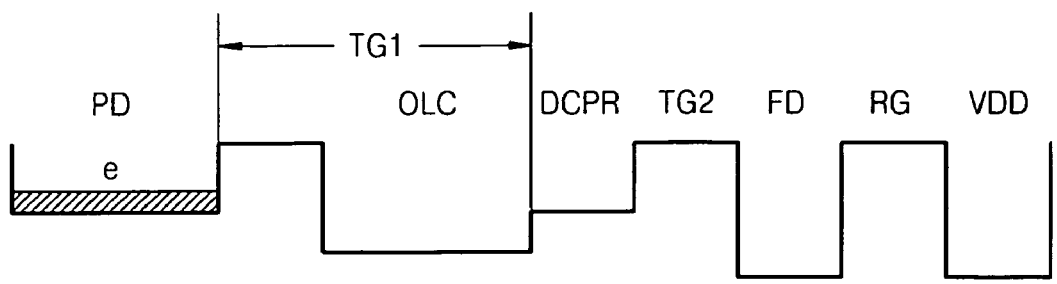
FIGS. 8A, 8B, 8C, and 8D are energy band diagrams of transistor channels in the pixel circuit of FIG. 5 for various driving conditions, according to an embodiment of the present invention.

Thereafter, the charge accumulating interval 710 for the photodiode PD is started when the first transfer control signal TX1 is set to the zero level, and the second transfer control signal TX2 is set to the logic low state. As the photodiode PD begins to accumulate charge (e), the photodiode PD, the first transfer transistor TG1, the storage capacitor OLC, the surface-doped region DCPR, the second transfer transistor TG2, and the reset transistor RG have the energy distribution as illustrated in FIG. 8A.

Subsequently, the charge storing capacitor OLC is reset once more toward the end of the charge accumulating interval 710 when the first transfer control signal TX1 is set to the negative level and the second transfer control signal TX2 is set to the logic high state.

Figure 8B:
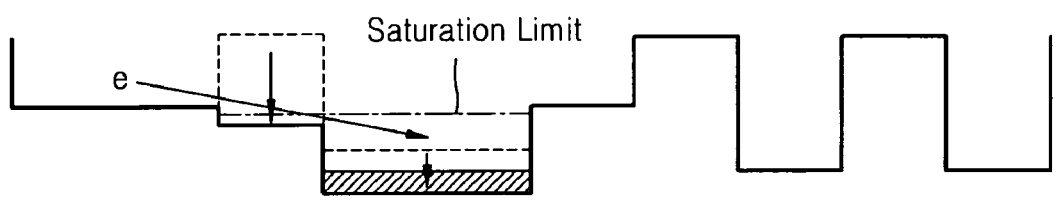

After the charge accumulating interval 710, the TX2 is set to the logic low state, and the first transfer control signal TX1 is set to the positive level. In that case, the charge generated at the photodiode PD is transferred to the charge storing capacitor OLC during a charge transfer interval 720. FIG. 8B illustrates the energy distribution across the photodiode PD, the first transfer transistor TG1, the storage capacitor OLC, the surface-doped region DCPR, the second transfer transistor TG2, and the reset transistor RG during the charge transfer interval 720.

Referring to FIG. 8B, the channel barrier of the first transfer transistor TG1 is lowered and the N-type doped capacitor diffusion region OLC has lower potential. Such energy distribution is amenable for transfer of the charge generated at the photodiode PD to the charge storing capacitor OLC.

Referring to FIGS. 5 and 9, each of the pixel circuits 604, 606, 608, and 610 in the APS array 602 in FIG. 9 is implemented similarly to the pixel circuit 510 of FIG. 5. Thus, each of the pixel circuits 604, 606, 608, and 610 has a respective set of components PD, TG1, OLC, DCPR, TG2, FD, RG, SF, and SG configured as shown in FIG. 5. Referring to FIGS. 7 and 9, the row driver 616 generates a respective set of control signals SEL, RX, TX2, and TX1 for each of the pixel circuits 604, 606, 608, and 610 in the APS array 602.

For the global shutter operation, the row driver 616 generates such respective sets of control signals to all of the pixels of the APS array 602 such that the charge accumulating interval 710 and the subsequent charge transfer interval 720 occur simultaneously for all rows of the pixel circuits in the APS array 602. Thus, respective charge is generated in each photo-diode of the pixel circuits of the whole APS array 602 simultaneously. In addition, such respective charge is transferred to each charge storing capacitor OLC of the pixel circuits of the whole APS array 602 simultaneously.

Figure 8C:
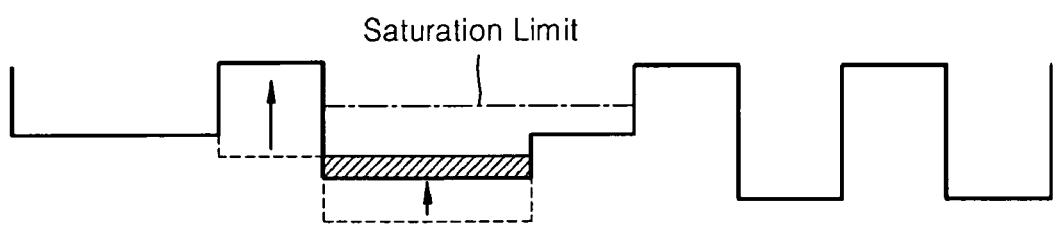

Referring back to FIG. 7, after the charge transfer interval 720, the first transfer control signal TX1 is set to the zero level while the first transfer control signal TX2 remains set to the logic low level. Thereafter, reset and image signals VRES and VSIG are read out sequentially for a selected row at a time. Until a row selection signal SEL for selecting a corresponding row is activated to the logic state, respective charges within pixels circuits of the unselected rows remains stored in the charge storing capacitor OLC in a standby interval 730 with the energy distribution as illustrated in FIG. 8C.

In the APS array 602, the last selected row is in the standby state for a longest time. A higher number of rows increases a total time of the standby interval 730. For preventing dark current from being generated in rows having long standby intervals, the region DCPR is doped with a dopant of opposite conductivity type from the dopant of the capacitor diffusion region OLC.

After the standby interval 730, a row is selected when the corresponding row selection signal SEL is activated to the logic high state while the reset control signal RX is set to the logic high state. Thereafter the reset control signal RX is activated to the logic low state for coupling the first supply voltage VDD to the floating diffusion node FD.

The source follower transistor SF and the selection transistor SG operate to output a reset signal VRES corresponding to respective charge stored at the floating diffusion node FD at that point for a reset level read out in FIG. 7. Such a reset signal VRES is input by the ADC 618 in FIG. 9.

Figure 8D:
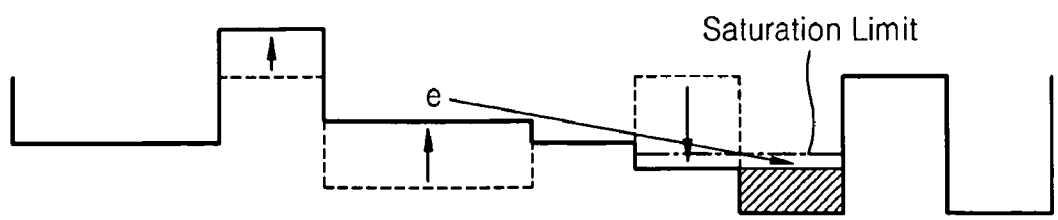

Thereafter, the second transfer control signal TX2 is activated to the logic high state, and the first transfer control signal TX1 is set to the negative level. With such controls signals TX2 and TX1 during a timer interval 740, the charge stored in the charge storing capacitor OLC is transferred to the floating diffusion node FD. FIG. 8D illustrates the energy distribution during such transfer of charge from the charge storing capacitor OLC to the floating diffusion node FD.

Subsequently, the second transfer control signal TX2 is set to the logic low state, and the first transfer control signal TX1 is set to the zero level, after the charge stored in the charge storing capacitor OLC has been completely transferred to floating diffusion node FD. The source follower transistor SF and the row selection transistor SG output an image signal VSIG corresponding to the respective charge at the floating diffusion node FD at that point for a signal level read out in FIG. 7. Such an image signal VSIG is input by the ADC 618 in FIG. 9.

The ADC 618 uses the analog reset and image signals VRES and VSIG for generating a digital signal of a difference between such signals VRES and VSIG in the correlated double sampling technique. In this manner, the reset signal VRES corresponding to the image signal VSIG is read out immediately prior to the image signal VSIG even in the global shutter operation, similar to the rolling shutter operation.

Thus, noise is minimized in the digital signal of the difference between the reset and image signals VRES and VSIG. Such low noise advantageously enhances image quality. The converted digital signal is output to a digital signal processor (not shown) and interpolated for further processing. The digital signal processor generates driving signals appropriate to a resolution of a display, such as a LCD, for displaying the image captured by the APS array 602 on the display.

In this manner, the reset signal VRES is generated immediately before the image signal VSIG for reduced noise in the subsequent CDS (correlated double sampling). In addition, the surface-doped region DCPR prevents dark current from the charge storing capacitor OLC such that rows with long stand-by times do not lose charge in the global shutter operation. Thus, picture-quality is preserved in the global shutter operation even when the active pixel sensor array 602 has a large number of rows.

The foregoing is by way of example only and is not intended to be limiting. For example, any numbers or number of elements described and illustrated herein is by way of example only. In addition, any type of device or any type of material as described and illustrated herein is by way of example only. Furthermore, the present invention has been described for use within a CMOS image sensor. However, the present invention may be used in any other type of image sensor.

The present invention is limited only as defined in the following claims and equivalents thereof.

What is claimed is:

1. A pixel circuit of an image sensor, comprising:
 a photo-converting unit for generating charge from incident light;
 a charge storing unit for storing the charge generated by the photo-converting unit;
 a floating diffusion node that receives the charge from the charge storing unit after being reset;
 a first transfer transistor disposed between the photo-converting unit and the charge storing unit;
 a second transfer transistor disposed between the charge storing unit and the floating diffusion node;
 wherein the first and second transfer transistors each have a respective source/drain region of a first conductivity type formed in a semiconductor substrate; and
 a surface doped region of a second conductivity type that is opposite of said first conductivity type, wherein the surface doped region is formed in a portion of the semiconductor substrate separating gate structures of the transfer transistors, and wherein the surface doped region abuts only the charge storing unit within the semiconductor substrate.

2. The pixel circuit of claim 1, wherein the first conductivity type is N-type, and wherein the second conductivity type is P-type.

3. The pixel circuit of claim 1, wherein the charge storing unit is a capacitor having a first node formed with the gate structure of the first transfer transistor.

4. The pixel circuit of claim 3, wherein the capacitor includes a capacitor diffusion region formed in the semiconductor substrate.

5. The pixel circuit of claim 4, wherein the surface-doped region is formed within a portion of the capacitor diffusion region that is disposed between the gate structures of the first and second transfer transistors.

6. The pixel circuit of claim 5, wherein the surface-doped region is oppositely doped from the capacitor diffusion region that forms a source/drain for the first and second transfer transistors, for reducing dark-current while the capacitor holds the charge from the photo-converting unit.

7. The pixel circuit of claim 1, wherein a driver generates control signals with a first set of levels to the first and second transfer transistors such that the charge storing unit is first reset for generating a reset signal before the charge generated from the photo-converting unit is transferred to the charge storing unit, and for generating the control signals with a second set of levels to the first and second transfer transistors such that the charge from the charge storing unit is transferred to the floating diffusion node for generating an image signal after the reset signal is generated.

8. The pixel circuit of claim 1, further comprising:
   a reset transistor coupled to the floating diffusion node for resetting the floating diffusion node; and
   a source follower transistor and a selection transistor coupled to the floating diffusion node for outputting a signal corresponding to an amount of charge stored at the floating diffusion node.

9. The pixel circuit of claim 1, wherein the photo-converting unit is a photo-diode, and wherein the image sensor is a CMOS (complementary metal oxide semiconductor) image sensor.

10. An image sensor comprising:
    an active pixel sensor array of a plurality of pixel circuits, each pixel circuit including:
       a respective photo-converting unit for generating respective charge from incident light;
       a respective charge storing unit for storing the respective charge generated by the respective photo-converting unit;
       a respective floating diffusion node that receives the respective charge from the respective charge storing unit after being reset;
       a respective first transfer transistor disposed between the respective photo-converting unit and the respective charge storing unit;
       a respective second transfer transistor disposed between the respective charge storing unit and the respective floating diffusion node;
       wherein the respective first and second transfer transistors each have a respective source/drain region of a first conductivity type formed in a semiconductor substrate; and
       a respective surface doped region of a second conductivity type that is opposite of said first conductivity type, wherein the respective surface doped region is formed in a respective portion of the semiconductor substrate separating gate structures of the respective transfer transistors, and wherein the surface doped region abuts only the charge storing unit within the semiconductor substrate; and
    a driver for generating control signals for timing transfer of the respective charge.

11. The image sensor of claim 10, wherein the first conductivity type is N-type, and wherein the second conductivity type is P-type.

12. The image sensor of claim 10, wherein the driver generates control signals with a first set of levels to the respective first and second transfer transistors such that the respective charge storing unit is first reset for generating a respective reset signal before the respective charge generated from the respective photo-converting unit is transferred to the respective charge storing unit, and for generating the control signals with a second set of levels to the respective first and second transfer transistors such that the respective charge from the respective charge storing unit is transferred to the respective floating diffusion node for generating a respective image signal after the respective reset signal is generated.

13. The image sensor of claim 10, wherein the driver generates control signals with a first set of levels to the respective first and second transfer transistors such that respective charges are transferred to the respective charge storing units from the respective photo-converting units simultaneously for the array of pixel circuits in a global shutter operation, and for generating the control signals with a second set of levels such that respective charges are transferred from the respective charge storing units to the respective floating diffusion nodes for a selected row of the array at a time.

14. The image sensor of claim 13, wherein the respective charges remain stored in the respective charge storing units for any unselected row of the array.

15. The image sensor of claim 14, wherein the respective charge storing unit is a capacitor having a first node formed with the gate structure of the respective first transfer transistor.

16. The image sensor of claim 15, wherein the capacitor includes a capacitor diffusion region formed in the semiconductor substrate.

17. The image sensor of claim 16, wherein the surface-doped region is formed within a portion of the capacitor diffusion region that is disposed between the gate structures of the respective first and second transfer transistors.

18. The image sensor of claim 17, wherein the surface-doped region is oppositely doped from the capacitor diffusion region that forms a source/drain for the respective first and second transistors, for reducing dark-current while the capacitor holds the respective charge in the unselected row.

19. The image sensor of claim 10, wherein each pixel circuit further includes:
    a respective reset transistor coupled to the respective floating diffusion node for resetting the respective floating diffusion node; and
    a respective source follower transistor and a respective selection transistor coupled to the respective floating diffusion node for outputting a respective signal corresponding to a respective amount of charge stored at the respective floating diffusion node.

20. The image sensor of claim 10, wherein the respective photo-converting unit is a photo-diode, and wherein the image sensor is a CMOS (complementary metal oxide semiconductor) image sensor.

* * * * *